United States Patent
Barr et al.

(10) Patent No.: US 7,205,210 B2
(45) Date of Patent: Apr. 17, 2007

(54) SEMICONDUCTOR STRUCTURE HAVING STRAINED SEMICONDUCTOR AND METHOD THEREFOR

(75) Inventors: Alexander L. Barr, Crolles (FR);
Dejan Jovanovic, Austin, TX (US);
Bich-Yen Nguyen, Austin, TX (US);
Mariam G. Sadaka, Austin, TX (US);
Voon-Yew Thean, Austin, TX (US);
Ted R. White, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/780,143

(22) Filed: Feb. 17, 2004

(65) Prior Publication Data

US 2005/0181549 A1 Aug. 18, 2005

(51) Int. Cl.
*H01L 21/30* (2006.01)
*H01L 21/46* (2006.01)

(52) U.S. Cl. .............................. 438/455; 257/E21.122

(58) Field of Classification Search ................. 438/455
See application file for complete search history.

(56) References Cited

U.S. PATENT DOCUMENTS

| | | | | |
|---|---|---|---|---|
| 6,039,803 A * | 3/2000 | Fitzgerald et al. | ............ | 117/89 |
| 6,429,061 B1 | 8/2002 | Rim | | |
| 6,555,839 B2 * | 4/2003 | Fitzgerald | ..................... | 257/18 |
| 6,803,264 B2 * | 10/2004 | Yamazaki et al. | .......... | 438/151 |
| 6,815,278 B1 * | 11/2004 | Ieong et al. | ................ | 438/198 |
| 2003/0227057 A1 * | 12/2003 | Lochtefeld et al. | ......... | 257/347 |
| 2005/0070115 A1 * | 3/2005 | Maa et al. | .................. | 438/706 |
| 2005/0205934 A1 * | 9/2005 | Lochtefeld et al. | ......... | 257/347 |

FOREIGN PATENT DOCUMENTS

WO    WO 02/45156     6/2002
WO    WO02/080241 A1  10/2002

OTHER PUBLICATIONS

M. Shima et al—"<100> Channel Strained—SiGe p-MOSFET with Enhanced Hole Mobility and Lower Parasitic Resistance" (2002 Symposium on VLSI Technology Digest of Technical Papers, p. 94-95.

(Continued)

*Primary Examiner*—W. David Coleman
(74) *Attorney, Agent, or Firm*—James L. Clingan, Jr.; Daniel D. Hill

(57) ABSTRACT

A first semiconductor structure has a silicon substrate, a first silicon germanium layer grown on the silicon, a second silicon germanium layer on the first silicon germanium layer, and a strained silicon layer on the second silicon germanium layer. A second semiconductor structure has a silicon substrate and an insulating top layer. The silicon layer of the first semiconductor structure is bonded to the insulator layer to form a third semiconductor structure. The second silicon germanium layer is cut to separate most of the first semiconductor structure from the third semiconductor structure. The silicon germanium layer is removed to expose the strained silicon layer where transistors are subsequently formed, which is then the only layer remaining from the first semiconductor structure. The transistors are oriented along the <100> direction and at a 45 degree angle to the <100> direction of the base silicon layer of the second silicon.

15 Claims, 4 Drawing Sheets

OTHER PUBLICATIONS

Langdo et al., "Preparation of Novel SiGe-Free Strained Si on Insulator Substrates," Amberwave Systems Corp., Salem, NH, 2 pgs.

Matsumoto et al., "Novel SOI Wafer Engineering Using Low Stress and High Mobility CMOSFET with <100>Channel for Embedded RF/Analog Applications," IEEE, pp. 663-666 (2002).

Sayama et al., "Effect of <100> Channel Direction for High Performance SCE Immune pMOSFET with Less Than 0.15 μm Gate Length," IEEE, 4 pgs., (1999).

Aoki et al., "Optimum Crystallographic Orientation of Submicrometer CMOS Devices Operated at Low Temperatures," IEEE Transactions on Electron Devices, vol. ED-34, No. 1, Jan. 1987, pp. 52-57.

* cited by examiner

US 7,205,210 B2

SEMICONDUCTOR STRUCTURE HAVING STRAINED SEMICONDUCTOR AND METHOD THEREFOR

FIELD OF THE INVENTION

This invention relates to semiconductor devices, and more particularly, to semiconductor devices that are made in active area of semiconductor that is strained.

RELATED ART

A continuing desire for transistors is that they have improved performance. One of these importance performance characteristics is the current that the transistor can carry for a given input, which is based on the carrier mobility. This is often referenced as the I V curve, which is the curve that is a plot of drain current versus gate to source voltage. This electron and hole mobility is desirably increased but also it is important to keep leakage low.

Thus, there is a need for improved carrier mobility for transistors while maintaining low leakage.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect active semiconductor is achieved by combing a first semiconductor structure and a second semiconductor structure. The first semiconductor structure has a base of silicon, a first silicon germanium layer grown on the silicon that is a transition layer, a second silicon germanium layer on the first silicon germanium layer that is substantially monocrystalline and less defective compared to the first silicon germanium layer. The second semiconductor structure has a base of silicon and a top layer that is an insulator layer. The silicon layer of the first semiconductor structure is bonded to the insulator layer to form a third semiconductor structure. The second silicon germanium layer is cut to separate most of the first semiconductor structure from the third semiconductor structure. The silicon germanium layer is removed to expose the silicon layer, and transistors are formed in the silicon layer, which is then the only layer remaining from the first semiconductor structure. The transistors are oriented along the <100> direction and at substantially a 45 degree angle to the <110> direction of the base silicon layer of the second silicon. This is better understood by reference to the figures and the following description.

Figure 1:
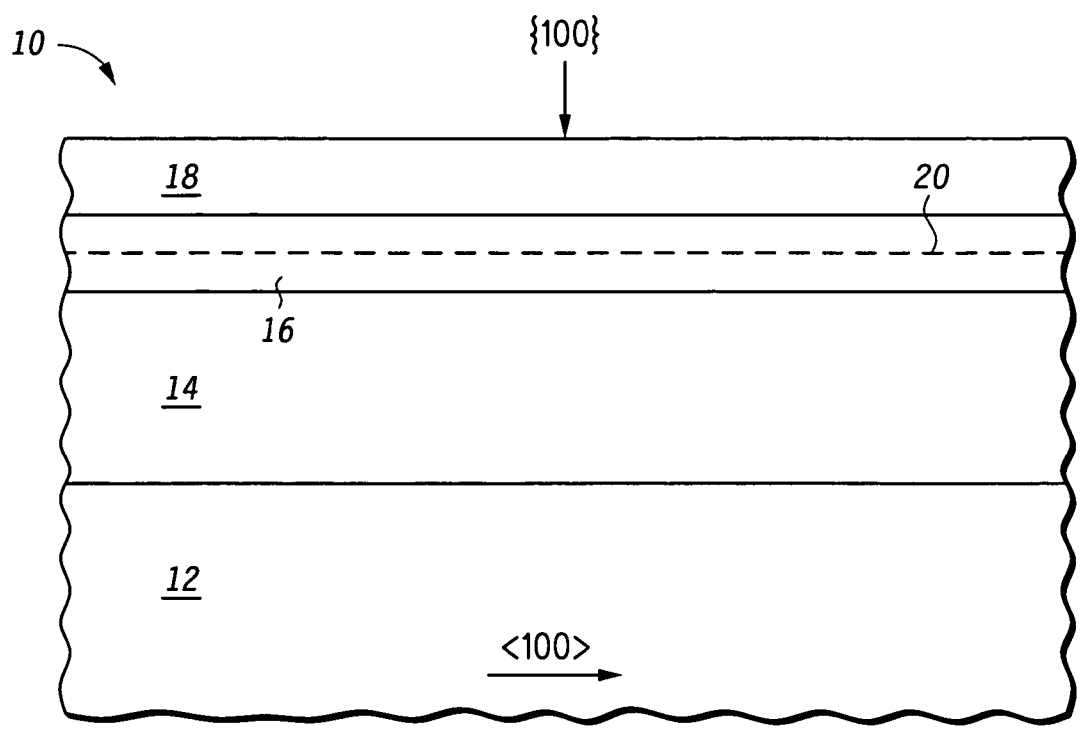
FIG. 1 is a cross section of a first semiconductor structure useful in a first embodiment of the invention.

Shown in FIG. 1 is a semiconductor structure 10 comprising a semiconductor layer 12 of silicon, a silicon germanium layer 14 on semiconductor layer 12, a silicon germanium layer 16 on silicon germanium layer 14, and a silicon layer 18 on silicon germanium layer 16. In this cross section the <100> direction of the crystal of silicon layer 12 is laterally along the face of the cross section. The angle brackets (< >) indicate a family of directions; in this case 100, 010, and 001. Silicon layer 18 preferably has a top surface having an orientation of {100}. This top surface of silicon layer 18 may alternatively have the {110} orientation. The braces ({ }) indicate a family of planes. For example, in the case of {100} it means the 100, 010, and 001 planes.

Silicon layer 12 is much thicker than any of the other layers and may be around 500 microns. Silicon layer 12 is useful in providing structural support. Silicon germanium layer 14 is made by providing silicon and adding germanium content until a predetermined amount is reached. An effective amount for this predetermined amount of germanium has been found to be 25% germanium. Silicon germanium layer 14 thus has a graded germanium concentration from 0% at the interface with silicon layer 12 to 25% at the interface with silicon germanium layer 16 such that it may be at least partially relaxed. Silicon germanium layer 16 is made using a consistent amount of germanium, which in this case is 25%. Silicon germanium layer 14 is about 2.5 microns in thickness. Silicon germanium layer is about 0.25 microns in thickness. Silicon layer 18 is much thinner at about 200 Angstroms. This structure is readily achieved using well known semiconductor on insulator (SOI) manufacturing techniques. The crystal orientation of silicon layer 12 is transferred to silicon germanium layer 14 but it becomes more relaxed as the silicon germanium grows. Silicon germanium layer 16 is preferably fully relaxed but maintains the same orientation. The resulting silicon layer, grown on silicon germanium layer 16, is strained due to being under tensile stress. A hydrogen or helium implant is performed to form an implant line 20 in silicon germanium layer 16. This implant line 20 creates a region that aids splitting silicon germanium layer 16.

Figure 2:
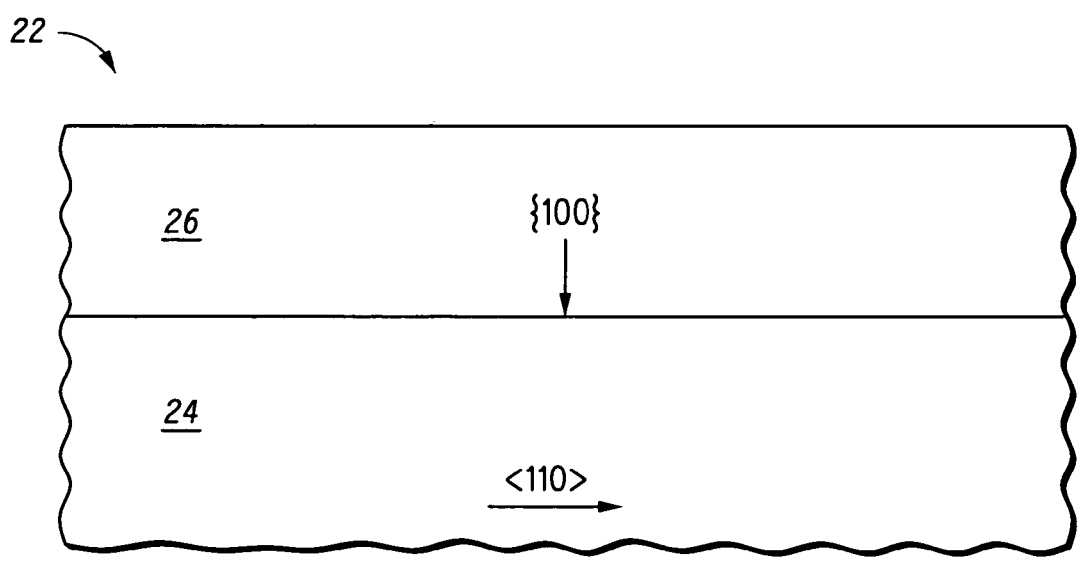
FIG. 2 is a cross section of a second semiconductor structure useful to the first embodiment of the invention.

Shown in FIG. 2 is a semiconductor structure 22 having a silicon layer 24 and a buried oxide layer 26. Silicon layer 24 has a crystal lattice in which a direction lateral along the cross section is the <110> direction. This is the direction in which silicon most naturally breaks. Thus it is desirable to break up individual integrated circuits along this direction. A plane along the surface of silicon layer 24 is the {100} orientation. Silicon base layer is about 500 microns in thickness. Buried oxide layer 26 is about 1400 Angstroms.

Figure 3:
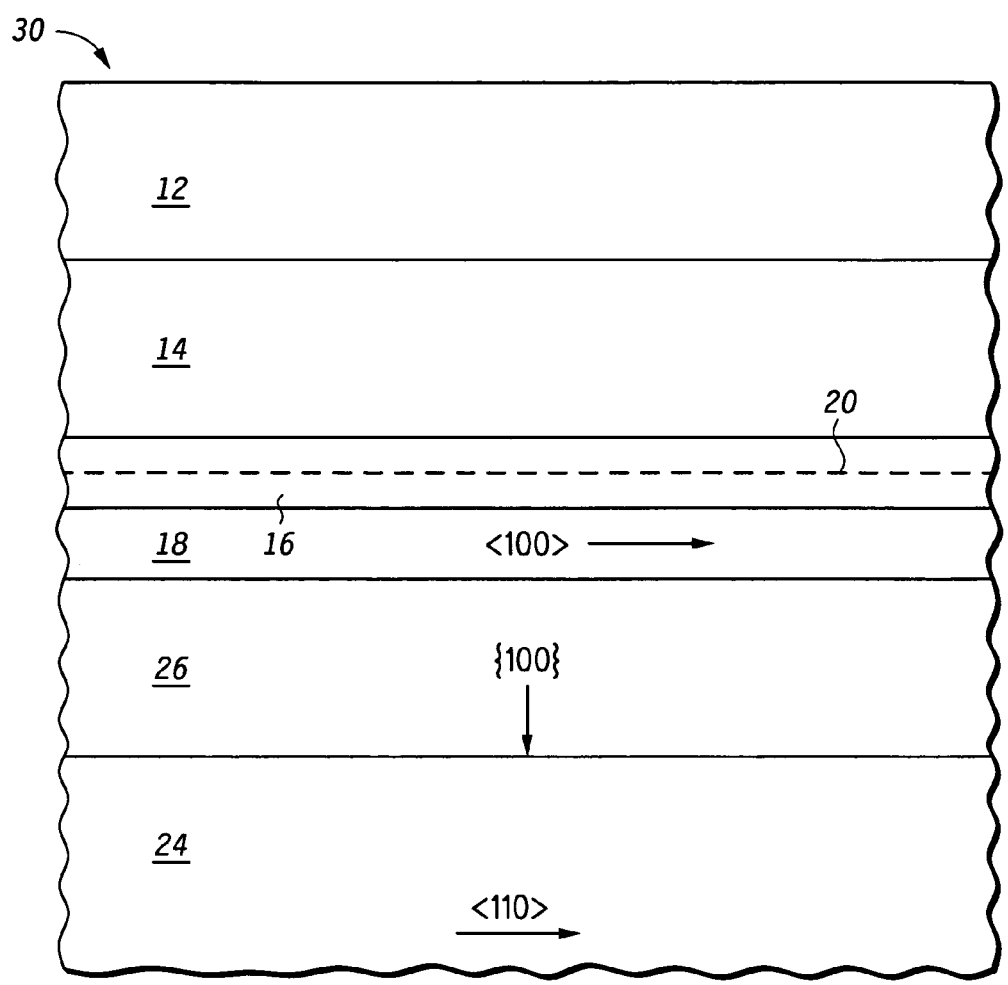
FIG. 3 is a cross section of a third semiconductor structure that combines the first and second semiconductor structures according to the first embodiment of the invention.

Shown in FIG. 3 is a semiconductor structure 30 which combines semiconductor structures 10 and 22 by inverting semiconductor structure 10 and bonding silicon layer 18 with buried oxide layer 26. This bond is made by applying heat. Silicon layer 18 will have at least a thin native oxide and it may be desirable to increase that thickness prior to joining semiconductor substrates 10 and 22. The cross section shown in FIG. 3 is the same as that for semiconductors structures 10 and 22 shown in FIGS. 1 and 2. Thus semiconductor structure 30, after the joining has been formed, has silicon layer 24, buried oxide layer 26 on silicon layer 24, silicon layer 18 on buried oxide layer 26, silicon germanium layer 18 on silicon layer 18, silicon germanium layer 14 on silicon germanium layer 16, a silicon layer 12 on silicon germanium layer 14, and implant line 20 in silicon germanium layer 16.

Figure 4:
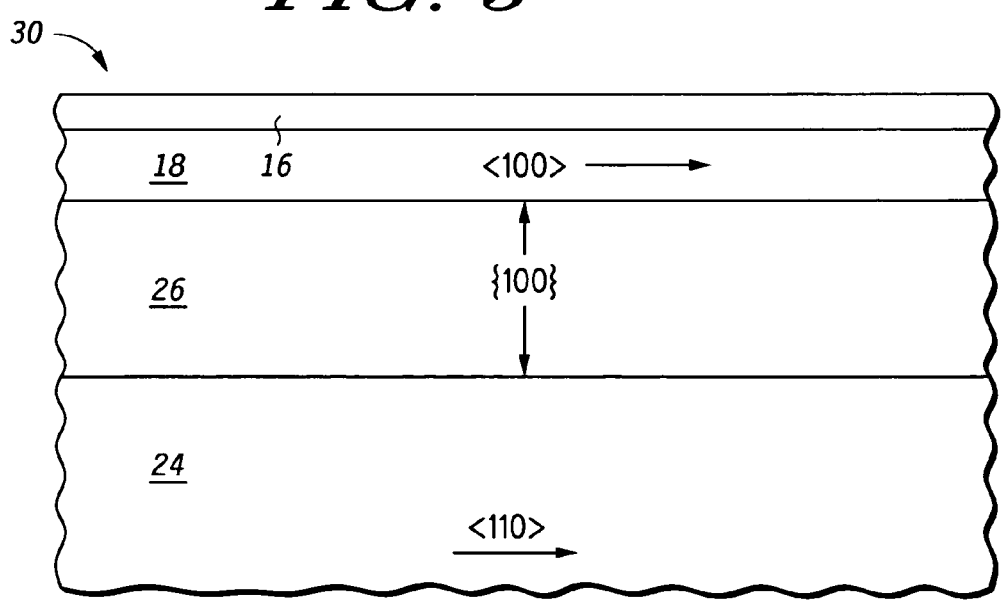
FIG. 4 is a cross section of the third semiconductor structure of FIG. 3 at a subsequent stage in processing according to the first embodiment of the invention.

Shown in FIG. 4 is semiconductor structure 30 after splitting silicon germanium layer 16 at implant line 20. This leaves a portion of silicon germanium layer 16 and silicon layer 18 over buried oxide layer. At this point semiconductor structure 30 comprises a semiconductor structure 22, silicon layer 18 on buried oxide 26, and the portion of silicon germanium layer 16 on silicon layer 18. Laterally along the cross section of silicon layer 18 is the <100> direction. Laterally along the cross section of silicon layer 24 is the <110> direction. The plane of the interface between silicon layer 18 and buried oxide layer 26 and the plane of the interface between silicon layer 24 and buried oxide layer 26 is the {100} plane. Because silicon layer 18 is already bonded to buried oxide layer 26 when silicon layer 12 is severed from silicon layer 18, the tensile stress is maintained as is the resulting strain.

Figure 5:
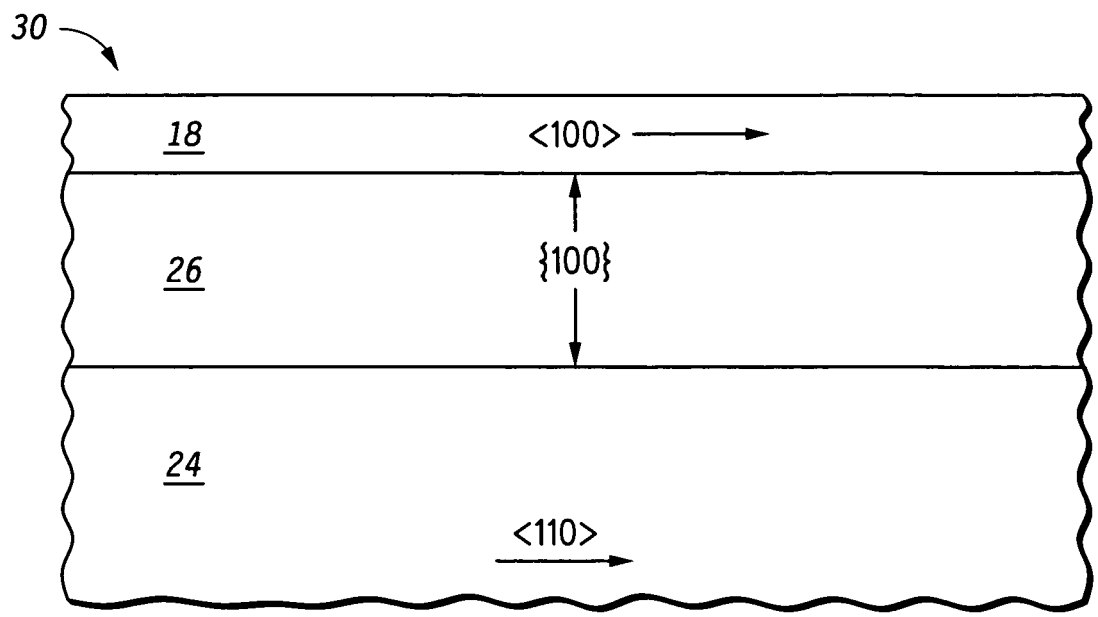
FIG. 5 is a cross section of the third semiconductor structure of FIG. 4 at a subsequent stage in processing according to the first embodiment of the invention.

Shown in FIG. 5 is semiconductor structure 30 after removal of the remaining portion of silicon germanium layer 16. The result is a semiconductor on insulator (SOI) substrate useful in making transistors. This SOI substrate has strained silicon for the active area for the transistors and this strained silicon has its <100> direction being the same as silicon layer 24's <110> direction.

Figure 6:
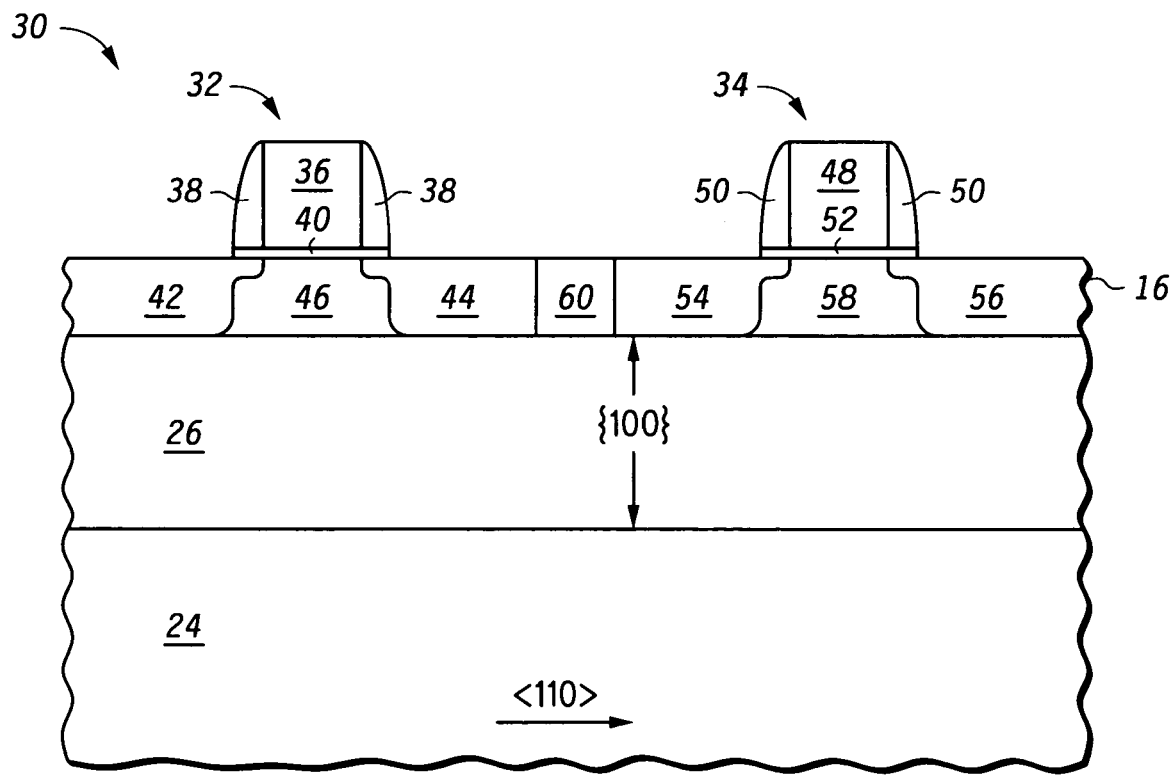
FIG. 6 is a cross section of the third semiconductor structure of FIG. 5 at a subsequent stage in processing according to the first embodiment of the invention.

Shown in FIG. 6 is semiconductor structure 30, after formation of transistors 32 and 34, formed in and over silicon layer 16 which is a pre-strained silicon layer because it is strained prior to transistor formation including prior to formation of the isolation regions. Transistor 32 has a gate 36 over silicon layer 16, a sidewall spacer 38 around gate 36, a gate dielectric 40 between gate 36 and silicon layer 16, a source/drain region 42 on one side of gate 36 in silicon layer 16, a source drain region 44 on an opposite side of gate 36 in silicon layer 16, and a channel 46 between source/drain regions 42 and 44. Transistor 34 has a gate 48 over silicon layer 16, a sidewall spacer 50 around gate 48, a gate dielectric 52 between gate 48 and silicon layer 16, a source/drain region 54 on one side of gate 48 in silicon layer 16, a source drain region 56 on an opposite side of gate 48 in silicon layer 16, and a channel 58 between source/drain regions 54 and 56. Transistors 32 and 34 are separated by a tunnel isolation 60 formed of an insulator. Transistors 32 and 34 have their source/drains aligned in the <100> direction while having the substrate, silicon layer 24, which by far most strongly influences the direction of breaking of the silicon, be in the <110>. Transistors have active areas of strained silicon, current paths in the <100> direction, and break direction as well along the <100> direction. Thus the benefits of both strained silicon for N channel transistor enhancement and <100> for P channel transistor are obtained while maintaining the ability to break the wafers aligned to the transistor direction. This is an important alignment criteria due to the manner in which lithography equipment operates and layout design is performed. Transistors 32 may both be P or N type or different types of transistors.

Figure 7:
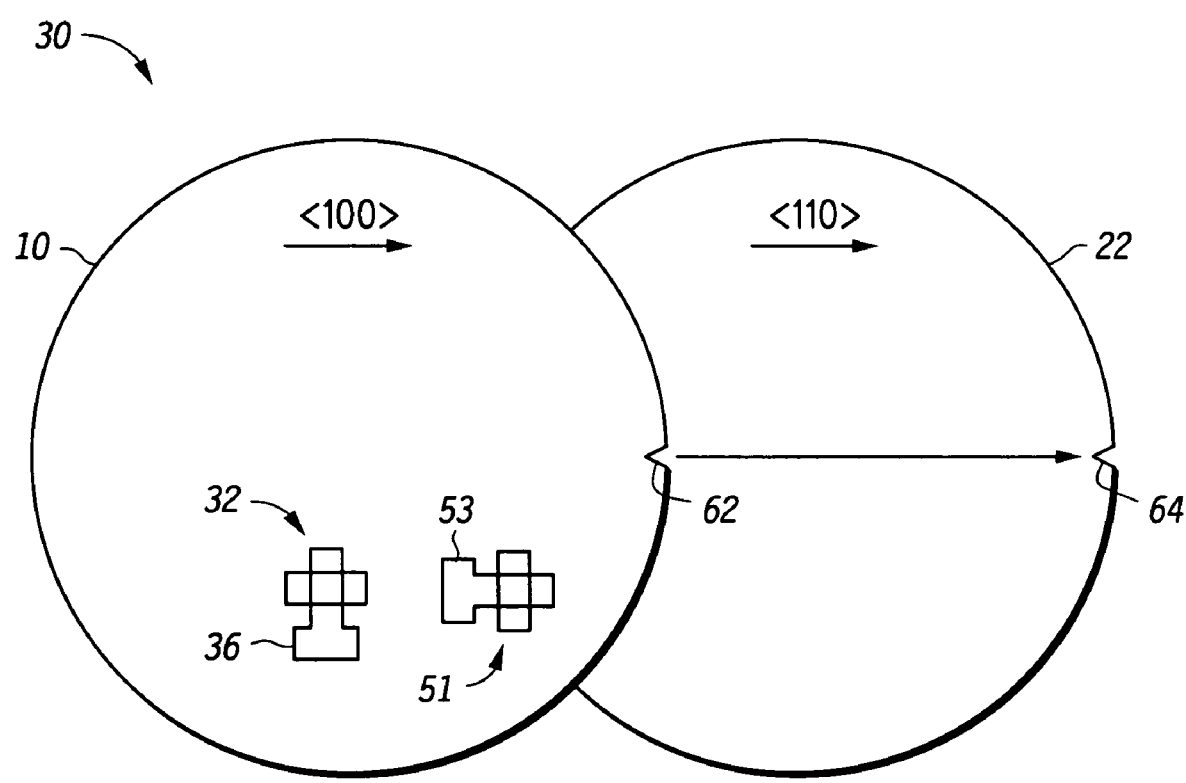
FIG. 7 is a top view of the first and second semiconductor structures of FIG. 6 being combined according to the first embodiment of the invention.

Shown in FIG. 7 is the forming of semiconductor structure 30 by combining semiconductor structures 10 and 22. Semiconductor structure 10 comprises a wafer having a notch 62 that is aligned to the <100> direction. Semiconductor structure 22 comprises a wafer having a notch 64 that is aligned to the <110> direction. This shows that notches 62 and 64 are aligned to each other to achieve the desired differing directions of orientation of the two wafers. Also shown in semiconductor structure 10 is transistor 32 and a transistor 51, which has a 90 degree alignment change compared to transistor 32. Transistor 32 has gate 36 in one direction, transistor 51 has a gate 53 in an orthogonal direction to that of the gate of transistor 32. This shows transistor alignments are along the <100> direction, which has been found to have as much as a 50% improvement in the I–V characteristic for small width devices, such as devices with channel widths below 0.5 micron.

As an alternative, an SOI wafer can be made having these similar characteristics by not growing silicon layer 18 on semiconductor structure 10. In such case a silicon germanium layer is in direct contact with the buried oxide layer 26. The severing can be accomplished in the same way so that there is a silicon germanium layer exposed above buried oxide layer 26. A strained silicon layer can then be grown on this silicon germanium layer and transistors formed on the grown strained silicon layer. In this case as well, the transistors are formed aligned to the <100> direction, the integrated circuit is cut from the wafer aligned to the <100> direction of the active semiconductor layer, and direction of the cut is in the <110> direction of the thick silicon that is the substrate. There may be advantages in providing different stresses in this approach and may provide more ability to separately optimize P and N channel transistors.

As another alternative, silicon layer 16 may be transferred from a simpler semiconductor structure than semiconductor structure 10. In such case the silicon is not stressed. This is a common approach for transferring a silicon layer to the buried oxide layer to form an SOI wafer. The difference is that the silicon layer being transferred that has a {100} surface is transferred such that its <100> direction is 45 degrees offset from the <100> direction of the underlying thick silicon substrate. As an alternative this silicon layer being transferred can have a {110} surface. After the silicon formation, a germanium condensation process may be used to develop a silicon germanium layer. This is known to be achievable by forming silicon germanium and oxidizing that layer which has the effect of driving germanium into the silicon layer with the desired concentration of germanium. The upper oxide layer is removed leaving a silicon germanium layer that has the desired concentration of germanium. A subsequent layer of silicon is then grown from the silicon germanium layer with the desired germanium concentration. This silicon over silicon germanium then forms the active semiconductor layer for transistor formation and can be made to have the desired strain based on the underlying germanium concentration and with the desired <100> orientation for transistor formation.

In the foregoing specification, the invention has been described with reference to specific embodiments. However, one of ordinary skill in the art appreciates that various modifications and changes can be made without departing from the scope of the present invention as set forth in the claims below. For example, other semiconductor materials different from germanium and silicon may be used in this manner to achieve this result. Various thicknesses have been specified but they can be changed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
   forming an insulating layer on a surface of a first semiconductor substrate;
   forming a first semiconductor layer comprising silicon and germanium over a second semiconductor substrate;
   forming a strained semiconductor layer comprising silicon over the first semiconductor layer;
   adhering the first semiconductor layer to the insulating layer;
   cleaving through the first semiconductor layer;
   removing any remaining portion of the semiconductor layer; and
   forming a transistor on the strained semiconductor layer, wherein the transistor is aligned along a <100> direction of the strained semiconductor layer.

2. The method of claim 1, wherein the strained semiconductor layer is in a tensile stress state.

3. A method for forming a semiconductor device comprising:
   providing a semiconductor substrate;
   forming an insulating layer on a surface of the semiconductor substrate;
   providing an at least partially relaxed silicon-germanium layer:
   forming a silicon layer on the at least partially relaxed silicon-germanium layer form a pre-strained semiconductor layer.
   bonding a pre-strained semiconductor layer to the insulating layer, wherein a <100> direction of the pre-strained semiconductor layer is aligned with a <110> direction of the semiconductor substrate;
   removing the at least partially relaxed silicon germanium layer; and
   forming a transistor on the pre-strained semiconductor layer, wherein the transistor is aligned along the <100> direction of the pre-strained semiconductor layer.

4. The method of claim 3 wherein the semiconductor device is characterized as being a silicon-on-insulator device.

5. The method of claim 3 wherein bonding of the pre-strained semiconductor layer to the insulating layer is performed by thermal wafer bonding.

6. The method of claim 3 wherein forming a transistor on the pre-strained semiconductor layer comprises aligning a source/drain axis of the transistor along the <100> direction of the pre-strained semiconductor layer.

7. The method of claim 3 wherein forming a transistor on the pre-strained semiconductor layer comprises aligning a source/drain axis of the transistor perpendicular to the <100> direction of the pre-strained semiconductor layer.

8. Method for forming a semiconductor device comprising:
   providing a semiconductor substrate;
   defining a <110> direction of the semiconductor substrate;
   forming an insulating layer on a surface of the semiconductor substrate;
   providing a pre-strained semiconductor layer on a SiGe layer;
   defining a <100> direction of the pre-strained semiconductor layer;
   bonding the pre-strained semiconductor layer to the insulating layer, wherein the <100> of the pre-strained semiconductor layer is aligned with the <110> direction of the semiconductor substrate;
   cleaving the SiGe layer to leave a remaining portion of the SiGe layer on the pre-strained semiconductor layer; and
   removing the remaining portion of the SiGe layer after cleaving; and
   forming a transistor on the pre-strained semiconductor layer, wherein the transistor is aligned along the <100> direction of the pre-strained semiconductor layer.

9. Method for forming a semiconductor device comprising:
   providing a semiconductor substrate;
   forming an insulating layer on a surface of the semiconductor substrate;
   providing an at least partially relaxed silicon-germanium layer; and
   forming a silicon layer on the at least partially relaxed silicon-germanium layer to form a pre-strained semiconductor layer
   bonding the pre-strained semiconductor layer to the insulating layer, wherein the crystal orientation of the pre-strained semiconductor layer is not aligned with the crystal orientation of the semiconductor substrate;
   removing the at least partially relaxed silicon-germanium layer; and
   forming a transistor on the pre-strained semiconductor layer, wherein a source/drain axis of the transistor is aligned along a crystal orientation of the pre-strained semiconductor layer that enhances current transport capability of a PMOS transistor.

10. The method of claim 9 wherein the semiconductor device is a silicon-on-insulator device.

11. The method of claim 9 wherein the crystal orientation of the semiconductor substrate comprises a <110> direction of the semiconductor substrate.

12. The method of claim 9 wherein defining a the crystal orientation of the pre-strained semiconductor layer comprises defining a <100> direction of the pre-strained semiconductor layer.

13. The method of claim 12 wherein forming a transistor on the pre-strained semiconductor layer comprises aligning a source/drain axis of the transistor along the <100> direction of the pre-strained semiconductor layer.

14. The method of claim 13 wherein forming a transistor on the pre-strained semiconductor layer comprises aligning a source/drain axis of the transistor perpendicular to the <100> direction of the pre-strained semiconductor layer.

15. The method of claim 9 further comprising polishing the pre-strained semiconductor layer after cleaving through the at least partially relaxed silicon-germanium layer.

* * * * *

UNITED STATES PATENT AND TRADEMARK OFFICE
CERTIFICATE OF CORRECTION

| | | |
|---|---|---|
| PATENT NO. | : 7,205,210 B2 | Page 1 of 1 |
| APPLICATION NO. | : 10/780143 | |
| DATED | : February 17, 2004 | |
| INVENTOR(S) | : Alexander L. Barr et al. | |

It is certified that error appears in the above-identified patent and that said Letters Patent is hereby corrected as shown below:

Column 5, Line 45, Claim No. 3:
    Change "form" to --from--

Column 6, Line 3, Claim No.8:
    Change "Method" to --A method--

Column 6, Line 25, Claim No.9:
    Change "Method" to --A method--

Column 6, Line 51, Claim No.12:
    Delete "a" after "defining".

Signed and Sealed this

Twentieth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 7,205,210 B2  Page 1 of 1
APPLICATION NO. : 10/780143
DATED : April 17, 2007
INVENTOR(S) : Alexander L. Barr et al.

It is certified that error appears in the above-identified patent and that said Letters Patent is hereby corrected as shown below:

Column 5, Line 45, Claim No.3:
    Change "form" to --from--

Column 6, Line 3, Claim No.8:
    Change "Method" to --A method--

Column 6, Line 25, Claim No.9:
    Change "Method" to --A method--

Column 6, Line 51, Claim No.12:
    Delete "a" after "defining".

This certificate supersedes Certificate of Correction issued November 20, 2007.

Signed and Sealed this

Twenty-fifth Day of December, 2007

JON W. DUDAS
*Director of the United States Patent and Trademark Office*